(12) United States Patent
Poolakkaparambil et al.

(10) Patent No.: US 9,645,886 B2
(45) Date of Patent: May 9, 2017

(54) DIGITAL ERROR CORRECTION

(75) Inventors: Mahesh Poolakkaparambil, Bangalore (IN); Abusaleh Jabir, Abingdon (GB); Jimson Mathew, Bristol (GB); Dhiraj K. Pradhan, Bristol (GB)

(73) Assignee: Oxford Brookes University, Oxford (GB)

( * ) Notice: Subject to any disclaimer, the term of this patent is extended or adjusted under 35 U.S.C. 154(b) by 135 days.

(21) Appl. No.: 14/241,154

(22) PCT Filed: Aug. 10, 2012

(86) PCT No.: PCT/GB2012/051953
§ 371 (c)(1),
(2), (4) Date: Feb. 26, 2014

(87) PCT Pub. No.: WO2013/030528
PCT Pub. Date: Mar. 7, 2013

(65) Prior Publication Data
US 2014/0229786 A1    Aug. 14, 2014

Related U.S. Application Data

(60) Provisional application No. 61/608,694, filed on Mar. 9, 2012.

(30) Foreign Application Priority Data

Aug. 26, 2011   (GB) .................... 1114831.9

(51) Int. Cl.
*G06F 11/00* (2006.01)
*G06F 11/14* (2006.01)
(Continued)

(52) U.S. Cl.
CPC .......... *G06F 11/1412* (2013.01); *G06F 11/10* (2013.01); *G06F 11/1048* (2013.01);
(Continued)

(58) Field of Classification Search
CPC ...... G06F 11/10; G06F 11/14; G06F 11/1402; G06F 11/1412; G06F 11/1048;
(Continued)

(56) References Cited

U.S. PATENT DOCUMENTS 3,771,126 A * 11/1973 Apple, Jr. ............... H04L 1/004
714/782
4,241,446 A * 12/1980 Trubisky ............... H03M 13/19
714/777
(Continued)

FOREIGN PATENT DOCUMENTS

| JP | 2006318461 A | 11/2006 |
|----|--------------|---------|
| JP | 2007013806 A | 1/2007  |
| JP | 2009301194 A | 12/2009 |

OTHER PUBLICATIONS

J. Mathew et al., "Fault Tolerant Bit Parallel Finite Field Multipliers Using LDPC Codes," Circuits and Systems, 2008, IEE International Symposium, Piscataway, NJ, USA, May 18, 2008, pp. 1684-1687.
(Continued)

*Primary Examiner* — Albert Decady
*Assistant Examiner* — Osman M Alshack
(74) *Attorney, Agent, or Firm* — Fraser Clemens Martin & Miller LLC; William J. Clemens

(57) ABSTRACT

Error-correcting circuit includes: component generating a first output from first and second inputs; error detector generating an error flag indicative of whether or not an error is detected in the first output, based on the first output, and the first and second inputs; correction generator generating a correcting output after a first time period beginning with a timing event, based on the first output, and the first and second inputs; and output generator generating an output after a second time period beginning with the timing event. If the error flag indicates a detected error then the second time period may be longer than the first time period,
(Continued)

otherwise it may be not longer, and the error-correcting circuit output may include a combination of the first output and the correcting output whereby the detected error is corrected, otherwise the error-correcting circuit output may correspond directly to the first output.

11 Claims, 10 Drawing Sheets

(51) Int. Cl.
G06F 11/10 (2006.01)
H03M 13/15 (2006.01)
H04L 1/00 (2006.01)
H03M 13/09 (2006.01)

(52) U.S. Cl.
CPC ......... G06F 11/1402 (2013.01); *H03M 13/09* (2013.01); *H03M 13/15* (2013.01); *H04L 1/0057* (2013.01)

(58) Field of Classification Search
CPC .... H03M 13/15; H03M 13/151; H03M 13/09; H03M 13/091; H04L 1/0057
USPC .......................................... 714/746, 752, 781
See application file for complete search history.

(56) References Cited

U.S. PATENT DOCUMENTS

| 4,277,844 A * | 7/1981 | Hancock | G06F 11/1076 |
| | | | 714/755 |
| 4,760,576 A * | 7/1988 | Sako | G11B 20/1252 |
| | | | 714/755 |
| 4,764,927 A * | 8/1988 | Izumita | H03M 13/29 |
| | | | 714/761 |
| 4,833,678 A * | 5/1989 | Cohen | H03M 13/151 |
| | | | 714/781 |
| 5,774,481 A * | 6/1998 | Meaney | H03M 13/13 |
| | | | 714/763 |
| 5,790,567 A * | 8/1998 | Bolotin | H03M 13/35 |
| | | | 370/341 |
| 6,637,002 B1 * | 10/2003 | Weng | H03M 13/6561 |
| | | | 708/507 |
| 6,732,325 B1 * | 5/2004 | Tash | H03M 13/15 |
| | | | 714/785 |
| 6,772,386 B2 * | 8/2004 | Iwata | G11B 20/1803 |
| | | | 714/755 |
| 7,266,749 B1 * | 9/2007 | Zhong | H03M 13/152 |
| | | | 714/756 |
| 7,403,964 B2 * | 7/2008 | Porten | G06F 7/724 |
| | | | 708/492 |
| 7,546,510 B2 * | 6/2009 | Dror | H03M 13/2906 |
| | | | 714/755 |
| 2002/0049947 A1 * | 4/2002 | Sridharan | H03M 13/152 |
| | | | 714/752 |
| 2003/0041300 A1 * | 2/2003 | Burns | G06F 7/724 |
| | | | 714/784 |
| 2003/0061558 A1 * | 3/2003 | Fackenthal | G06F 11/1008 |
| | | | 714/755 |
| 2005/0166130 A1 * | 7/2005 | Coene | H03M 5/145 |
| | | | 714/800 |
| 2006/0256615 A1 | 11/2006 | Larson | |
| 2007/0288798 A1 | 12/2007 | Flautner et al. | |
| 2009/0150744 A1 * | 6/2009 | Flynn | G06F 3/0619 |
| | | | 714/752 |
| 2009/0172501 A1 * | 7/2009 | Lablans | G06F 11/1072 |
| | | | 714/784 |
| 2010/0042907 A1 * | 2/2010 | Pilsl | H03M 13/152 |
| | | | 714/782 |
| 2012/0303986 A1 * | 11/2012 | Flynn | G01R 31/31854 |
| | | | 713/320 |

OTHER PUBLICATIONS

M. Poolakkaparambil et al., "BCH Code Based Multiple Bit Error Correction in Finite Field Multiplier Circuits," Quality Electronic Design, 2011, 12th IEEE International Symposium, Mar. 14, 2011, pp. 1-6.

Mathew J. et al., "Fault Tolerant Reversible Finite Field Arithmetic Circuits", On-Line Testing Symposium, 2008. IOLTS '08. 14th IEEE International, IEEE, Piscataway, NJ, USA, Jul. 7, 2008, pp. 188-189.

* cited by examiner

| C0 | C1 | C2 | C3 | C4 | Ham/BCH Parity -1 |
| --- | --- | --- | --- | --- | --- |
| C5 | C6 | C7 | C8 | C9 | Ham/BCH Parity -2 |
| C10 | C11 | C12 | C13 | C14 | Ham/BCH Parity -3 |
| C15 | C16 | C17 | C18 | C19 | Ham/BCH Parity -4 |
| CP0 | CP2 | CP4 | CP6 | CP8 | |
| CP1 | CP3 | CP5 | CP7 | CP9 | |

DIGITAL ERROR CORRECTION

The present invention relates to error correction. It has application in the design of error tolerant circuits, for example in circuits for performing arithmetic operations, but also in other types of circuit. Some aspects of the invention also have application in other areas such as error correction in communications and memory design.

Modern digital circuits are increasingly large and complex, and are therefore increasingly susceptible to errors for a variety of reasons. For example the decreasing scale of the circuits, and the lower voltages used to represent data, increase the chances of errors generally. Errors can occur, for example, as a result of energetic particles in the environments where the circuits are used causing bit-flips in the circuit, or simply as a result of manufacturing errors. Also the bombardment of circuits with energetic particles in deliberate attempts to induce errors in circuits can increasingly be a source of errors, particularly in cryptography. Therefore detection and/or correction of errors in digital circuits is becoming increasingly important.

As one example, finite field arithmetic, such as arithmetic over the Galois fields $GF(2^k)$, is used in numerous applications including cryptography. In cryptography, for example, fault tolerant circuits are desirable, not least because it is possible to learn secret information by causing faults in a circuit while it performs cryptographic operations. Towards achieving fault tolerant circuits for cryptography, finite field multiplication circuits with concurrent error detection and correction capabilities have been proposed. However these tend either to be very large, or to correct only single errors.

According to one aspect, the invention provides an error-correcting, or error tolerant, circuit comprising: a component arranged to generate a first output from a first input and a second input; a correction generator arranged to generate, based on the first output, the first input and the second input, a correcting output suitable for combining with the first output to correct an error therein; and a combiner arranged to combine the correcting output and the first output to thereby produce a second output in which the error in the first output has been corrected. The correction generator is preferably arranged to generate the correcting output using BCH decoding. The use of BCH coding and decoding is a surprisingly effective way to correct multiple errors in the circuit component arranged to generate the output.

Optionally, the circuit is able to receive one or more inputs, e.g. the first and second inputs, and then generate therefrom a correcting output in parallel with generation of the first result by the component, so that an error introduced in the first result by the component can be corrected, notwithstanding that the one or more inputs did not have error correction data associated therewith when received. In some cases, the circuit generates correction data 'on the fly', and in some examples can correct the first result in the same clock period in which the one or more inputs were received by the component.

Optionally, the circuit further comprises a check-bit generator, the check-bit generator is arranged to generate, based on the first input and the second input, at least one check bit, and the correction generator is arranged to generate the correcting output based on the first result and said at least one check bit.

Optionally, the check-bit generator is arranged to generate said at least one check bit directly from the first input and the second input, without separately generating the first result. This can help to simplify the design of the check-bit generator.

Optionally, the error detector is arranged to generate the error flag based on the first result and the at least one check bit, the error flag being indicative of whether or not the error detector has detected any one of a plurality of different errors that the error detector is arranged to detect, the plurality of different errors comprising an error in the first output and an error in the at least one check bit.

Optionally, the correction generator is suitable for generating the correcting output based on the first output and the at least one check bit, the correcting output being suitable for correcting any one of a plurality of different errors, the plurality of different errors comprising an error in the first output and an error in the at least one check bit.

Optionally, the correction generator is arranged to generate the correcting output by generating an error location polynomial and then searching for roots of the error location polynomial, wherein the correction generator searches only for roots corresponding to the first result. This can help significantly in the minimization of the size of the correction generator.

Optionally, the component arranged to generate the first output is arranged to generate the first output by performing an arithmetic operation on the first and second inputs.

Optionally, the arithmetic operation is a finite field arithmetic operation, such as a multiplication over a Galois fields $GF(2^k)$.

In another aspect, the invention provides an error-correcting circuit, arranged to receive a clock signal, comprising: a component arranged to generate a first output from a first input and a second input; an error detector arranged to generate an error flag indicative of whether or not it has detected an error in the first output, based on the first output, the first input and the second input; a correction generator suitable for generating a correcting output after a first time period beginning with a timing event in the clock signal, based on the first output, the first input and the second input; and an output generator arranged to generate an output of the error-correcting circuit after a second time period beginning with the timing event in the clock signal. If the error flag indicates that an error has been detected in the first output then the second time period may be longer than the first time period. Otherwise, the second time period may be not longer than the first time period. If the error flag indicates that an error has been detected in the first output then the output of the error-correcting circuit may comprise a combination of the first output and the correcting output whereby the error detected in the first output is corrected. Otherwise the output of the error-correcting circuit may correspond directly to the first output.

Circuits according to this aspect of the invention can be used in communications, memory, and other applications, as well as error tolerant circuit design. They can be used to increase the rate at which data is processed, e.g. by cryptographic, communications, or memory systems.

Optionally, the output generator comprises an output register having an output, the output of the output register being the output of the error-correcting circuit, and in which the output generator is arranged to delay the output register in updating its output when the error flag indicates that an error has been detected in the first output, thereby causing the second time period to be longer than the first time period.

Optionally, the output generator comprises an output enable component arranged to generate a gated clock based on the clock signal and the error flag, and in which the output register receives the gated clock at a clock input thereof, thereby preventing the output register from updating its output when the error flag indicates that an error has been detected in the first output.

For example, the received clock signal may have a constant period which is less than the second time period; the gated clock will have approximately the same period as the received clock signal until an error has been detected in the first output, at which point at least one period of the gated clock is extended to allow extra time for the correction generator to generate an appropriate correcting output.

Optionally, the circuit further comprises a check-bit generator, in which the check-bit generator is arranged to generate, based on the first input and the second input, at least one check bit, and in which the error detector and the correction generator are arranged to generate the error flag and the correcting output, respectively, based on the first output and said at least one check bit.

Optionally, the error detector is arranged to generate the error flag based on the first result and the at least one check bit, the error flag being indicative of whether or not the error detector has detected any one of a plurality of different errors that the error detector is arranged to detect, the plurality of different errors comprising an error in the first output and an error in the at least one check bit.

In contrast to the prior art, advantageously, errors in the check-bit generator may be detected.

Optionally, the correction generator is suitable for generating the correcting output based on the first output and the at least one check bit, the correcting output being suitable for correcting any one of a plurality of different errors, the plurality of different errors comprising an error in the first output and an error in the at least one check bit.

In contrast to the prior art, advantageously, errors in the check-bit generator may be corrected.

Optionally, the check-bit generator is arranged to generate said at least one check bit directly from the first input and the second input, without separately generating the first output.

Optionally, the correction generator is arranged to generate the correcting output by generating an error location polynomial and then searching for roots of the error location polynomial, wherein the correction generator searches only for roots corresponding to the first output.

Optionally, the component arranged to generate the first output is arranged to generate the first output by performing an arithmetic operation on the first and second inputs.

Optionally, the arithmetic operation is a finite field arithmetic operation, such as a multiplication over a Galois fields $GF(2^k)$.

In either of the first and second aspects of the invention, the output may comprise a plurality of bits and the correction generator may be arranged to allocate the output bits to a first set of groups and perform a first error detection step on each of the first set of groups, allocate the output bits to a second set of groups and perform a second error detection step on each of the second set of groups, use the results of the first and second error detection steps to perform an error location step to locate errors in the output.

According to a further aspect, the invention provides an error correcting circuit arranged to receive a system output comprising a plurality of output bits, allocate the output bits to a first set of groups and perform a first error detection step on each of the first set of groups, allocate the output bits to a second set of groups and perform a second error detection step on each of the second set of groups, use the results of the first and second error detection steps to perform an error location step to locate errors in the output, and to generate a corrected output from the received output and the result of the error location step.

Some circuits according to this aspect of the invention have the benefit that the error correction can be incorporated into the circuits with relatively low space overhead, as the error correction can be carried out in a generally efficient manner, and can correct a relatively high number of bit errors.

Optionally the first and second set of groups are arranged such that, for any of the output bits, the identity of the group, from the first set, of which it is a member and the identity of the group, from the second set, of which it is a member, uniquely identify the output bit.

For example, if the output bits are arranged in a rectangular table of rows and columns, the first set of groups may comprise the rows, and the second set of groups may comprise the columns, or vice versa. However it will be appreciated that the bits in the output can be allocated to the positions in the table in any order.

The circuit may comprise a sub-circuit arranged to perform each of the steps, for example it may include any one or more of: an allocation sub-circuit, a first error detection sub-circuit, a second error detection sub-circuit, an error location sub-circuit, and a correction sub-circuit.

The error detection steps, or sub-circuits, may each be arranged to determine the number of bit errors in the relevant group. For example they may be arranged to generate an error detection code, for example a parity code, for each group.

The groups in the first set may all be of the same size, or may be of different sizes. The groups in the second set may all be the same size, or may be of different sizes. The groups of the first set may be of the same size as, or of a different size from, the groups in the second set.

The system may be a functional circuit, such as a multiplier, in which case the output may be the result of a function performed on one or more inputs. In other cases the system may be a channel over which a communication is transmitted, in which case the output may be the communication as received from the channel. In other cases the system may be a memory circuit, in which case the output may be data retrieved from the memory circuit.

The circuit may further comprise, in any combination, any one or more features of any one or more of the preferred embodiments of the invention, which will now be described, by way of example only, with reference to the accompanying drawings of which:

FIGS. 9a, 9b, 9c and 9d are tables showing some examples of combinations of errors that can be corrected using the circuit of FIG. 7;

FIG. 10 is a table showing, for a modification of the embodiment of FIG. 7, some examples of combinations of errors that can be corrected;

Figure 13:
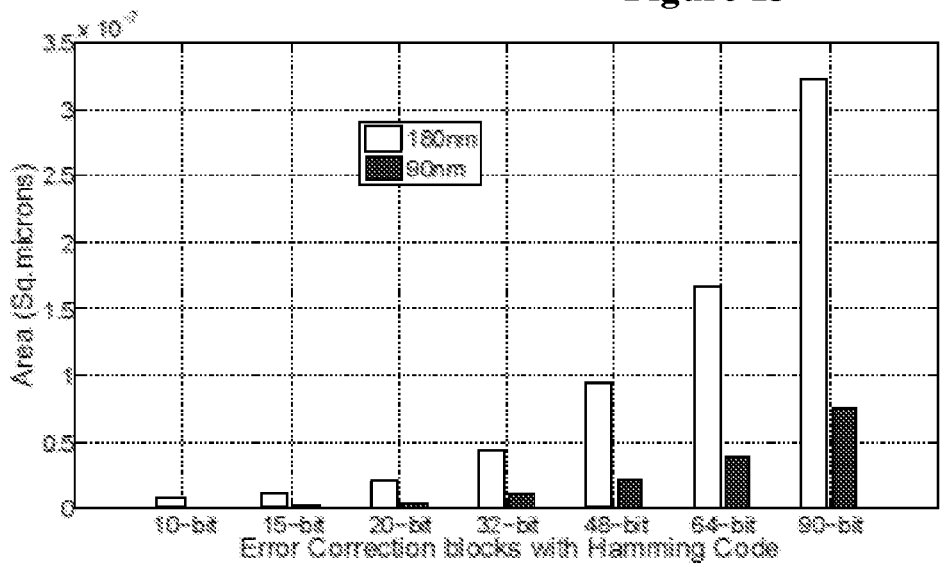
FIG. 13 is a graph showing the area of error detection and correction circuits for multipliers of different sizes using 180 nm and 90 nm technologies using Hamming codes for multiple error correction in each row of the table of bits.
Figure 14:
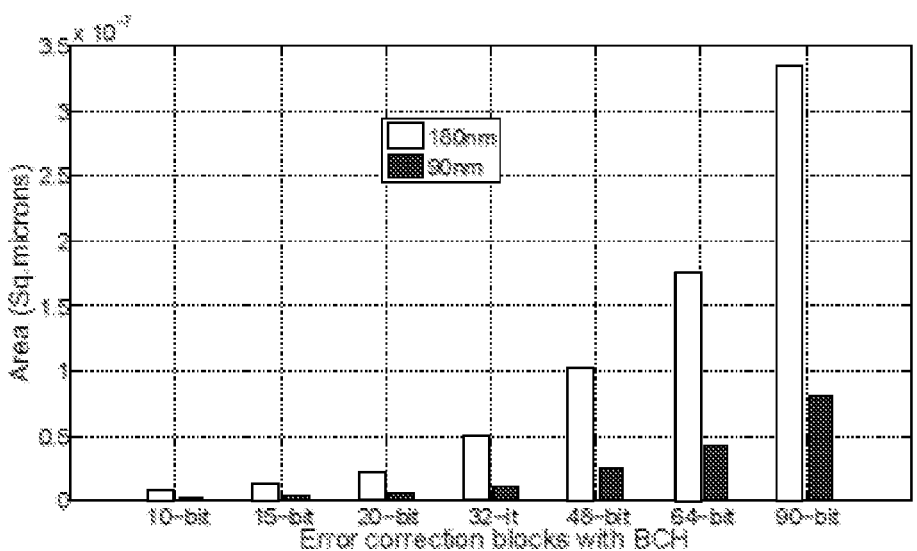
Figure 15:
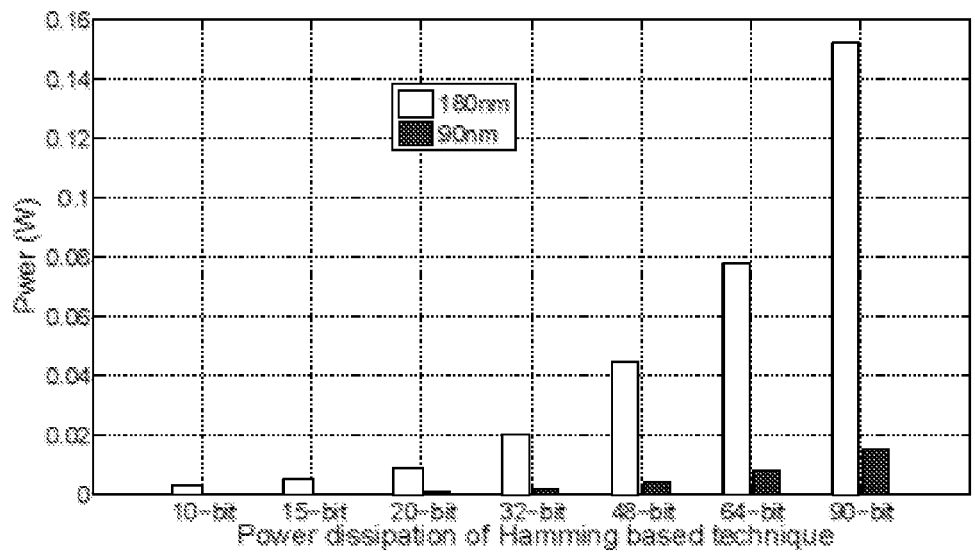
Figure 16:
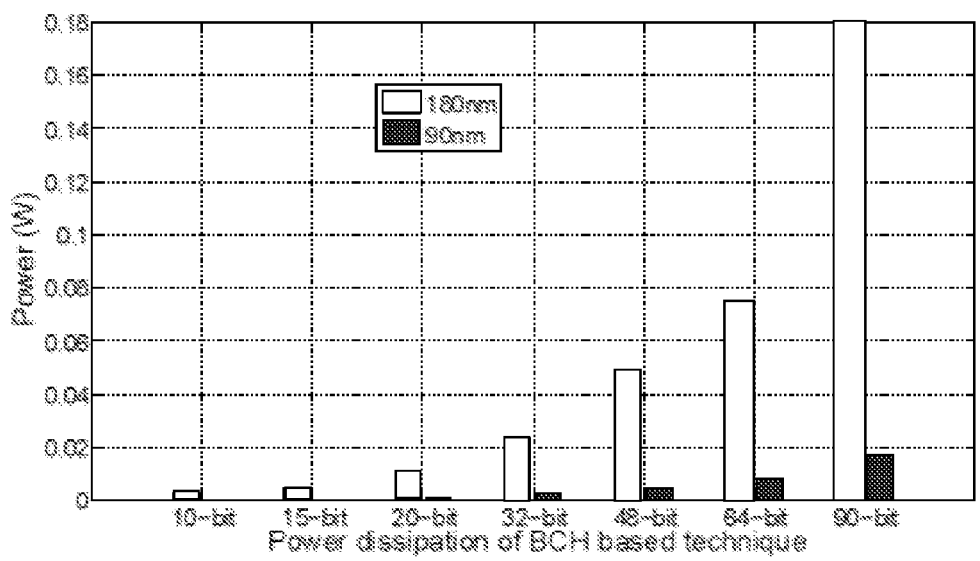

FIG. 14 is a graph showing the area of error detection and correction circuits for multipliers of different sizes using 180 nm and 90 nm technologies using BCH codes; and FIGS. 15 and 16 show the power consumption of the multiplier circuits with error detection and correction of FIGS. 13 and 14.

Figure 1:
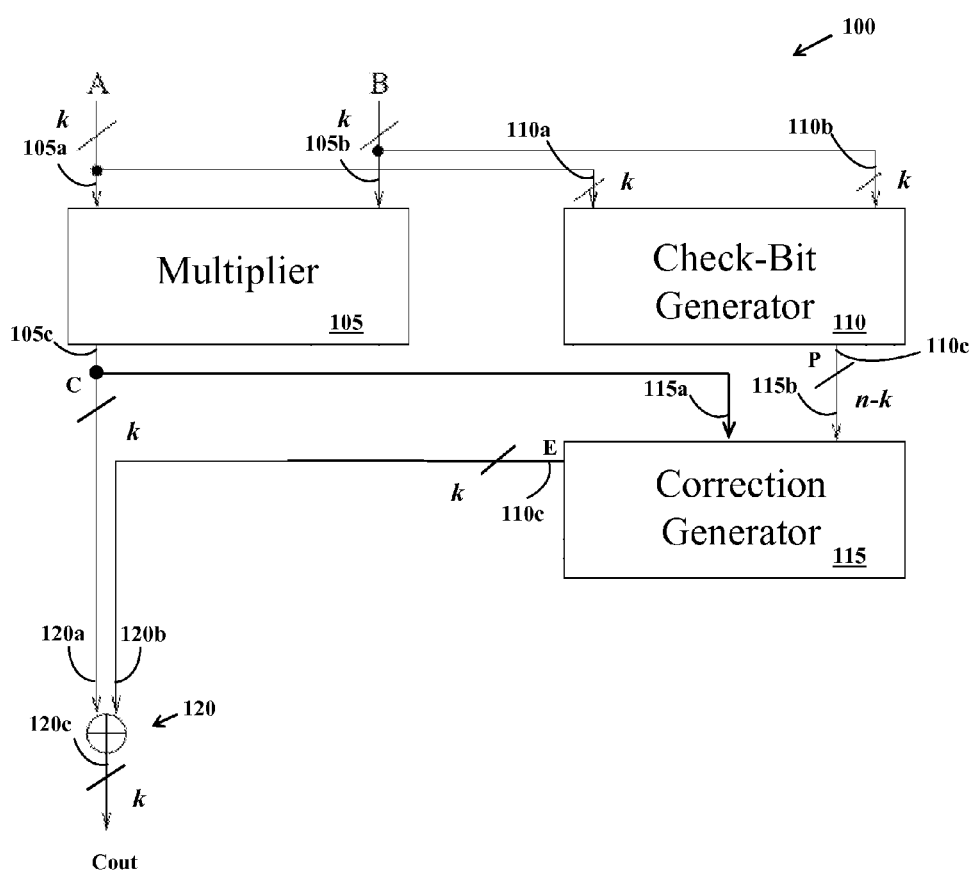
FIG. 1 is a schematic block diagram of a circuit, according to a first embodiment, for computing finite field multiplications and having concurrent error correction capabilities.

Referring to FIG. 1, in the first embodiment of the invention a circuit 100 includes a finite field multiplication sub-circuit 105 with two parallel inputs 105a,105b and a parallel output 105c. The multiplication sub-circuit 105 is arranged to generate a product C at the output 105c. The product C is the result of multiplying the two operands A,B, received at the two parallel inputs 105a,105b, over a Galois fields $GF(2^k)$ of which the two operands are elements. The two parallel inputs 105a,105b and the parallel output 105c are k bits wide, i.e. each consists of k bits.

In other embodiments, the finite field multiplication sub-circuit 105 may be replaced by circuits for performing other finite field arithmetic, such as multiplicative inversion or exponentiation (e.g., squaring) operations. In some embodiments, the finite field multiplication sub-circuit 105 may be replaced by circuits for performing arithmetic other than finite field arithmetic, such as two's complement binary arithmetic, for example.

In the first embodiment, the circuit 100 also includes a check-bit generator 110 with two k-bit parallel inputs 110a, 110b and an n–k bit parallel output 110c, which may be a single-bit output in some embodiments.

The check-bit generator 110 is arranged to receive the same two operands A,B as are received at the multiplication sub-circuit 105, and to generate a parity word P at the parallel output 110c. In some embodiments, the parity word P may be replaced by a parity bit.

The check-bit generator 110 comprises logic to generate a parity word P at the parallel output 110c. The parity word P is generated by performing a combination of finite field multiplication and BCH encoding on the two operands A,B received at the two parallel inputs 110a,110b. The logic of the check-bit generator 110 is arranged to generate the parity word P directly from the two operands A,B, rather than generating a multiplication result first and then generating the parity word P from that multiplication result, which the inventors found to be more efficient (e.g., smaller delay and/or fewer logic gates). The check-bit generator 110 does not output a multiplication result corresponding to the product C.

In this embodiment, the logic of the check-bit generator 110 was derived by substituting a conventional expression defining a multiplication over the Galois fields $GF(2^k)$—the same type of multiplication that is performed by the finite field multiplication sub-circuit 105—into a conventional expression defining the parity bits of a binary (n, k, t) BCH code (where k is the number of bits in the 'message', e.g. in each of the two operands A,B and in the product C, t is the number of errors that the circuit 100 can always correct, wherever they occur (higher numbers of errors can sometimes be corrected, but not in all cases), and n–k is the number of bits in the parity word P).

The circuit 100 further includes a correction generator 115 with two inputs 115a,115b and an output 115c. The two inputs 115a,115b are connected to, and the same width as, the output 105c of the multiplication sub-circuit 105 and the output 110c of the check-bit generator 110 respectively. The output 115c is a k-bit parallel output.

The correction generator 115 is arranged to receive the product C and the parity word P at its two inputs 115a,115b, and to generate at its output 115c a correcting value E. In this embodiment, the correction generator 115 comprises logic to generate the correcting value E by performing BCH decoding on the product C and the parity word P, as will be described in more detail below with reference to FIG. 2.

The circuit 100 further includes a combining sub-circuit 120 with two k-bit parallel inputs 120a,120b, which are connected to the output 105c of the multiplication sub-circuit 105 and the output 115c of the correction generator 115 respectively, and a k-bit parallel output 120c.

The combining sub-circuit 120 is arranged to receive the product C and the correcting value E, and to generate at the parallel output 120c a corrected product C'. In this embodiment, the combining sub-circuit 120 consists of a plurality of XOR gates (not shown), a respective one for each bit of the parallel output 120c. Each bit of the product C is combined via an exclusive-or operation (by a respective one of the XOR gates) with a corresponding bit of the correcting value E, which causes erroneous bits of the product C to be inverted (i.e., a logic 0 is inverted to a logic 1 and vice versa) in the corrected product C' thereby correcting the erroneous bits of the product C.

Figure 2:
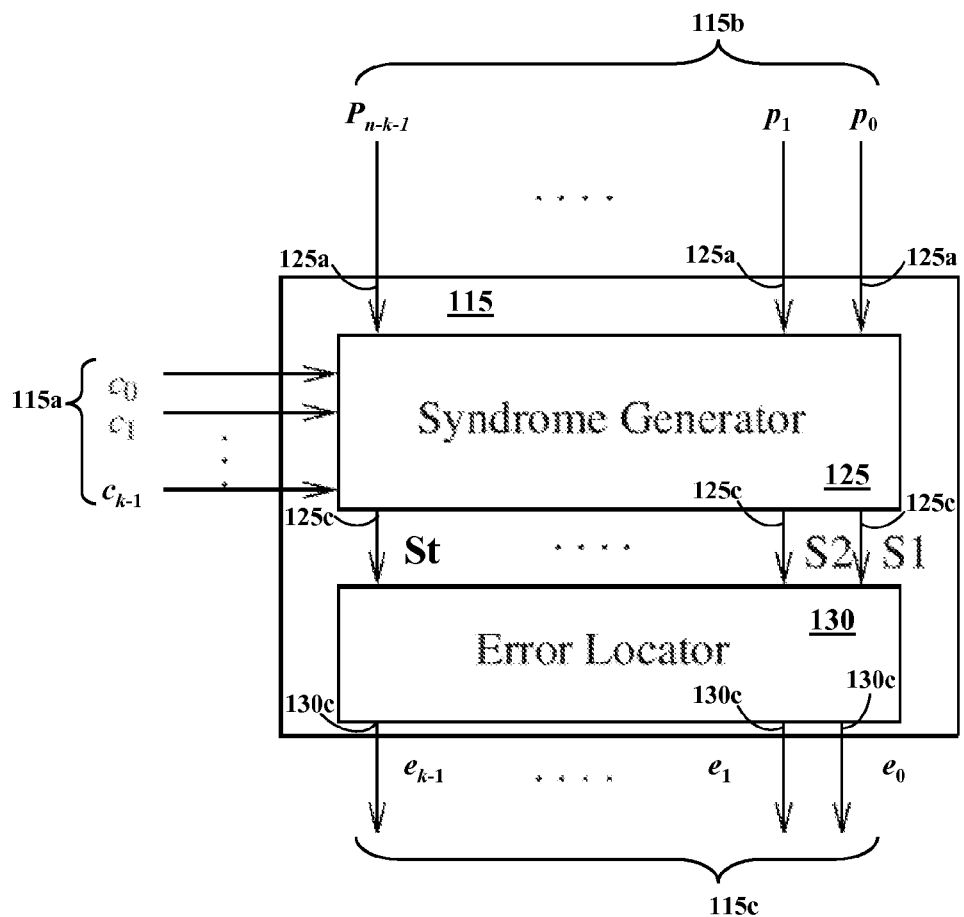
FIG. 2 is a schematic block diagram showing components of the Correction Generator block of FIG. 1.

Referring to FIG. 2, the correction generator 115 comprises a syndrome generator 125 and an error locator 130, and generates at its output 115c a k-bit correcting value E (shown individually as $e_{k-1} \ldots e_0$ in FIG. 2).

The syndrome generator 125 has two inputs 125a,125b and a t-bit wide parallel output 125c. The two inputs 125a,125b are connected to, and the same width as, the two parallel inputs 115a,115b of the correction generator 115 respectively. The syndrome generator 125 is arranged to receive the product C and the parity word P and to generate at its output 125c an error location polynomial St . . . S1. The syndrome generator 125 is arranged to generate the error location polynomial St . . . S1 using the well known Peterson-Gorenstein-Zierler algorithm, but other suitable methods of generating the error location polynomial St . . . S1 will be apparent to those skilled in the art and may be used in other embodiments.

The error locator 130 has a t-bit wide parallel input 130a, which is connected to the output of the syndrome generator 125, and has a k-bit wide parallel output 130c connected to the output 115c of the correction generator 115.

The error locator 130 is arranged to receive the error location polynomial St . . . S1 and to generate at its output 130c a correcting value E, which consists of k error locators $e_{k-1} \ldots e_0$. In this embodiment, the error locators are generated by finding the roots of the error location polynomial St . . . S1 using the well known Chien search algorithm. Advantageously, the error locator 130 does not search for the roots corresponding to the parity word P (since in this embodiment correction of the parity word P is not desired), which tends to reduce the amount of logic in the error locator 130 compared with the amount that would be required if the roots corresponding to the parity word P were searched for. In other embodiments, the error locator 130 may search for the roots corresponding to the parity word P. In such embodiments, the output of the correction generator may be t+k bits wide, and the correction generator may be arranged to generate at its output a correcting value suitable for correcting any one of a plurality of different errors, the plurality including errors in the parity word and errors in the product.

Figure 3:
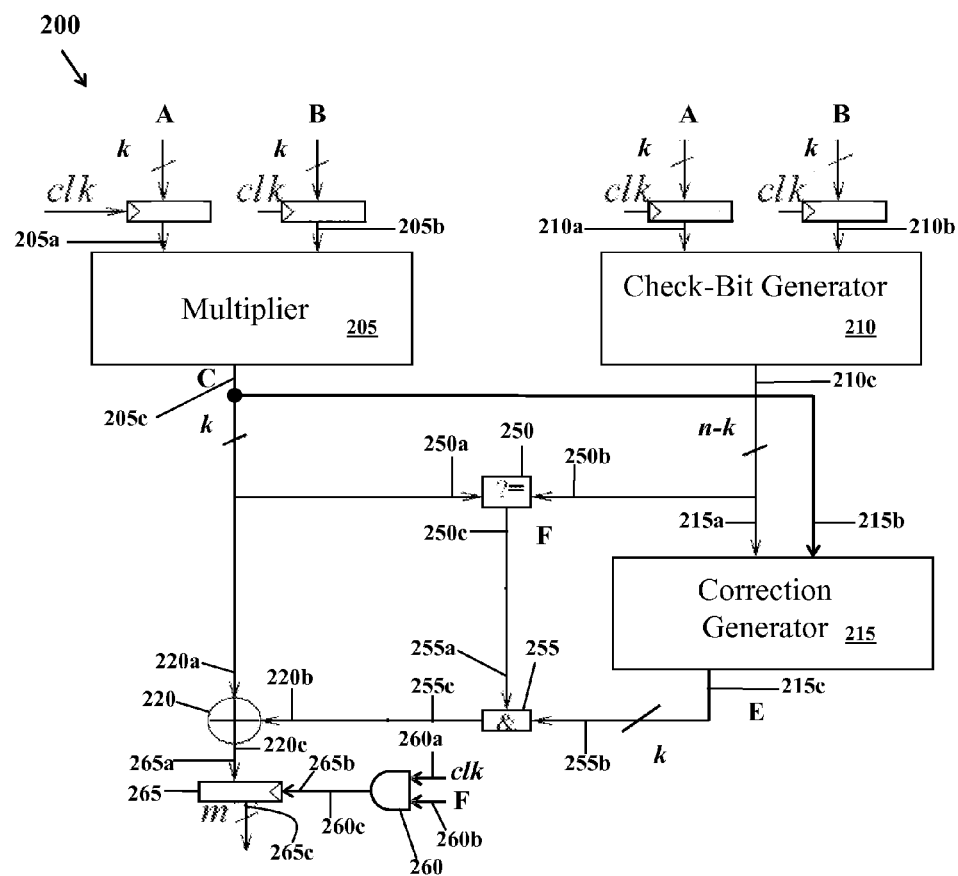
FIG. 3 is a schematic block diagram of a circuit, according to a second embodiment, for computing finite field multiplications and having concurrent error correction capabilities.

Referring to FIG. 3, in the second embodiment of the invention a circuit 200 includes a finite field multiplication sub-circuit 205, a check-bit generator 210 a correction generator 215 and a combining sub-circuit 220. Each of these components is substantially the same as the corresponding component (of the same name) of the first embodiment. The multiplication sub-circuit 205, the check-bit generator 210 and the correction generator 215 are connected together in the same way as in the first embodiment; these components need not be described further.

The circuit 200 also includes an error detection sub-circuit 250, a bit mask sub-circuit 255, an output enable sub-circuit 260 and an output register 265.

The error detection sub-circuit 250 has two inputs 250*a*, 250*b* and a one-bit output 250*c*. The two inputs 250*a*,250*b* are connected to, and the same width as, the output 205*c* of the multiplication sub-circuit 205 and the output 210*c* of the check-bit generator 210 respectively. The error detection sub-circuit 250 is arranged to detect an error in the product C and to detect an error in the parity word P, whether those errors occur individually or at the same time. Accordingly, the error detection sub-circuit 250 can detect one or more of a plurality of different errors.

Since the error detection sub-circuit 250 is connected to the check-bit generator 210, it does not need to generate check bits directly from the two operands A,B. This may be viewed as advantageous resource sharing between the error detection sub-circuit 250 and the correction generator 215, since a common module (the check-bit generator 210) is used to generate the parity word P for both rather than each including its own logic to derive the parity word P directly from the two operands A,B.

Figure 4:
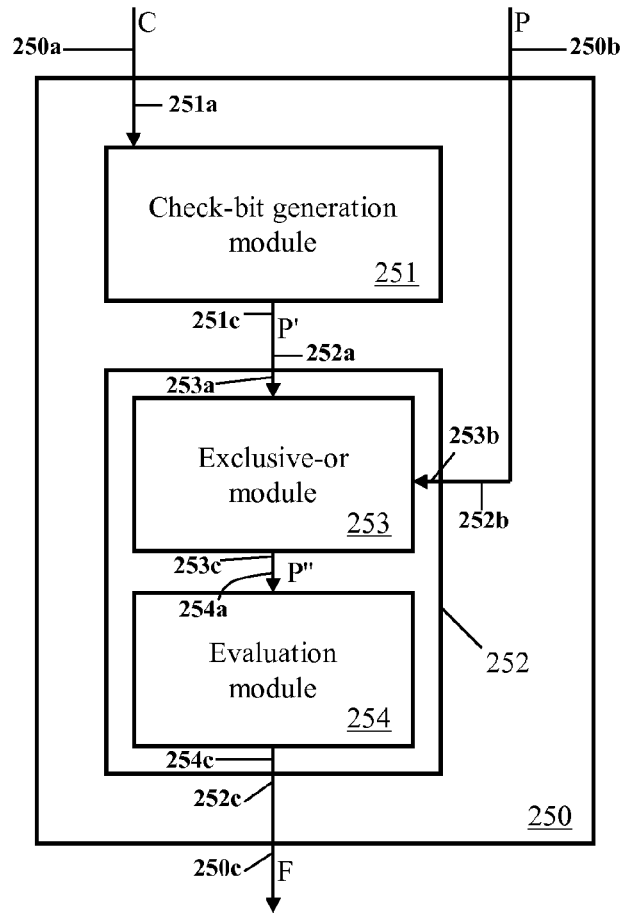
FIG. 4 is a schematic block diagram showing components of the error detection sub-circuit of FIG. 3.

Referring to FIG. 4, the error detection sub-circuit 250 comprises a check-bit generation module 251 and a comparison module 252.

The check-bit generation module 251 has a k-bit parallel input 251*a*, connected to a first one of the parallel inputs 250*a* of the error detection sub-circuit 250, and a parallel output 251*c* which is n–k bits wide.

The check-bit generation module 251 is arranged to receive the product C and to generate at its output 251*c* a further parity word P'. The further parity word P' is generated in a manner corresponding to the BCH encoding used by the check-bit generator 210 to generate the parity word P. Therefore, if there is no error present in the parity word P and there is no error present in the product C, then the further parity word P' will be equal to the parity word P.

The comparison module 252 has two inputs 252*a*,252*b* and a one-bit output 252*c* connected to the output 250*c* of the error detection sub-circuit 250. The two inputs 252*a*, 252*b* are connected to, and the same width as, the output 251*c* of check-bit generation module 251 and the second of the parallel inputs 250*b* of the error detection sub-circuit 250 respectively.

The comparison module 252 is arranged to receive the further parity word P' and the parity word P, and to generate at its output 252*c* an error flag F. The error flag F is indicative of whether any one of a plurality of different errors has been detected, the plurality including an error on the product C and an error in the parity word P.

Although other suitable arrangements are possible, in this embodiment the comparison module 252 consists of an exclusive-or module 253 and an evaluation module 254.

The exclusive-or module 253 has two parallel inputs 253*a*,253*b*, which are each n–k bits wide, connected to the output 251*c* of check-bit generation module 251 and the second of the parallel inputs 250*b* of the error detection sub-circuit 250 respectively, and a parallel output 253*c* of the same width.

The exclusive-or module 253 is arranged to receive the parity word P and the further parity word P', and to generate at its output 253*c* a third parity word P''', by performing a bit-wise exclusive-or operation on the parity word P and the further parity word P'.

The evaluation module 254 has a parallel input 254*a*, which is n–k bits wide, connected to the parallel output 253*c* of the exclusive-or module 253, and a one-bit output 254*c* connected to the output 252*c* of the comparison module 252.

The evaluation module 254 is arranged to receive the third parity word P''', to evaluate it in order to determine whether all of its bits are logic-0, and to generate at its output 254*c* the error flag F. If all of the bits of the third parity word P''' are zero then the evaluation module 254 sets the value of the error flag F to a logic-1 to indicate that no error is present in the product C or in the parity word P, else the evaluation module 254 sets the value of the error flag F to a logic-0 to indicate that one of the plurality of errors has been detected.

Referring again to FIG. 3, the bit mask sub-circuit 255 has two inputs 255*a*,255*b* and a k-bit parallel output 255*c*. The two inputs 255*a*,255*b* are connected to, and the same width as, the output 250*c* of the error detection sub-circuit 250 and the output 215*c* of the correction generator 215 respectively.

The bit mask sub-circuit 255 is arranged to receive the error flag F and the correcting value E and produces, and to generate at its output 255*c* a masked correcting value E'. The bit mask sub-circuit 255 is arranged to set every bit of the masked correcting value E' to a logic-0 if the error flag F is set to a logic-1 (i.e., if no error has been detected), else it sets the value of every bit so as to be equal to a respective corresponding bit of the correcting value E.

It will be appreciated that, in effect, the bit mask sub-circuit 255 suppresses the correcting value E if no error has been detected, e.g. in the product C or in the parity word P. Although other suitable arrangements are possible, in this embodiment the masked correcting value E' is the result of a bit-wise AND operation performed on the correcting value E and the logical inverse (i.e., a logic-1 is converted to a logic-0 and vice versa) of the error flag F.

The combining sub-circuit 220 has two k-bit parallel inputs 220*a*,220*b*, which are connected to the output 205*c* of the multiplication sub-circuit 205 and the output 255*c* of the bit mask sub-circuit 255 respectively, and a k-bit parallel output 220*c*.

The combining sub-circuit 220 is arranged to receive the masked correcting value E' and the product C, and to generate at its output 220*c* a corrected product C'. Although other suitable arrangements are possible, in this embodiment the combining sub-circuit 220 consists of a plurality of XOR gates (not shown), a respective one for each bit of the output 220*c*. Each bit of the product C is combined via an XOR operation (by a respective one of the XOR gates) with a corresponding bit of the masked correcting value E'.

If the error flag F is set to a logic-0 (i.e., if an error has been detected), the value of the masked correcting value E' will be equal to that of the correcting value E. Therefore the XOR operation performed on the product C and the masked correcting value E' can cause erroneous bits of the product C to be corrected in the corrected product C'.

If the error flag F is set to a logic-1, the value of corrected product C' will be the same as that of the product C, since each bit of the masked correcting value E' will be set to a logic-0.

The output enable sub-circuit 260 has two one-bit inputs 260a,260b, connected to the circuit's clock and to the output 250c of the error detection sub-circuit 250, and a one-bit output 260c.

The output enable sub-circuit 260 is arranged to receive the error flag F and a clock signal CLK, and to produce at its output 260c a gated clock signal ECLK. If the error flag F is set to a logic-0, the gated clock signal ECLK will be set to a logic-0. In this embodiment the output enable sub-circuit 260 consists of an AND-gate, arranged to receive the error flag F and the clock signal CLK at its inputs 260a,260b and to generate the gated clock signal ECLK as its output 260c.

The output register 265 has a k-bit input 265a connected to the output 220c of the combining sub-circuit 220, a clock input 265b connected to the output 260c of the output enable sub-circuit 260, and a k-bit output 265c.

The output register 265 is arranged to receive the corrected product C' and the gated clock signal ECLK, and to generate at its output 265c, in response to a timing event (e.g. a rising edge or a falling edge) of the gated clock signal ECLK, a circuit output Cout which corresponds to the corrected product C'.

Figure 5:
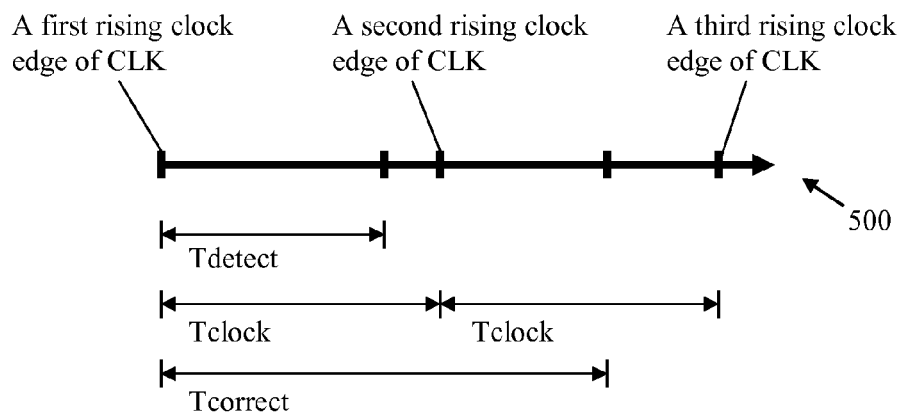
FIG. 5 is a timeline showing some time periods representative of respective propagation delays through different components of the circuit of FIG. 3.

With reference to the timeline 500 of FIG. 5, the error detection sub-circuit 250 generates, at its output 250c, an error flag F after a first time period Tdetect starting from a first rising clock edge of the clock signal CLK (or any other timing event in the clock signal CLK, such as a falling edge). Before the end of the first time period Tdetect, the multiplication sub-circuit 205 will have generated the product C at its output 205c.

The clock signal CLK has a clock period Tclock which is longer than the first time period Tdetect.

If the error flag F is set to a logic-1, indicating that there is no error in the product C, a rising edge in the clock signal CLK (or any other timing event in the clock signal CLK) received at the input 260b of the output enable sub-circuit 260 will cause a logic-1 value to be generated at the output 260c of the output enable sub-circuit 260, e.g. it will cause a rising edge (or other timing event corresponding to the timing event in the clock signal CLK) in the gated clock signal ECLK. Therefore, if the error flag F indicates that no error has been detected, the output register 265 will generate at its output 265c, after a period approximately equal to the clock period Tclock, a circuit output Cout which corresponds to the product C.

The correction generator 215 generates, at its output 215c, a correcting output E after a second time period Tcorrect staring from a rising clock edge of the clock signal CLK (or any other timing event in the clock signal CLK). The second time period Tcorrect is longer than the first time period Tdetect, and longer than the clock period Tclock.

In a latter part of the second time period Tcorrect, beginning when the first time period Tdetect ends and ending when the second time period Tcorrect ends, the multiplication sub-circuit 205 will have generated the product C at its output 205c but the correction generator 215 will not yet have generated at its output 215c a corresponding correcting output E. Therefore, any errors in the product C will not be corrected in the corrected product C' until after the second time period Tcorrect, because the correction generator 215 will not have generated the corresponding correcting output E before then.

The output enable sub-circuit 260 is arranged to prevent the output register 265 from generating a circuit output Cout which corresponds to the corrected product C' until after an error detected in the product C has been corrected in the corrected product C'. The error detected in the product C will cause the error flag F to be set to a logic-0 before the end of the clock period Tclock, which in turn will set the gated clock signal ECLK to a logic-0. Accordingly, the next rising edge in the clock signal CLK (or other timing event in the clock signal CLK) will not propagate though to the gated clock signal ECLK at the output enable sub-circuit's output 260c, which will remain at logic-0 at least until the subsequent rising edge (or other timing event in the clock signal CLK) in the clock signal CLK. This permits the correction generator 215 the time it needs to generate at its output 215c the correcting output E for combining with the product C in order to correct the error detected therein.

Because the clock period Tclock is shorter than the second time period Tcorrect, the circuit 200 can potentially generate more multiplication results in a given period of time than it would be able to if the clock period Tclock were the same as or longer than the second time period Tcorrect.

The skilled person would expect the clock period Tclock to be the same as or longer than the second time period Tcorrect, so that an error detected in the product C could be corrected if necessary in any clock period. But, typically, errors are relatively rare. By using a clock period Tclock that is shorter than the second time period Tcorrect, and preventing the output register 265 from updating its output 265c when an error has been detected in the product C (in order to allow the extra time required to generate the correcting output E), it is possible to generate more multiplication results in a given period of time.

Figure 6:
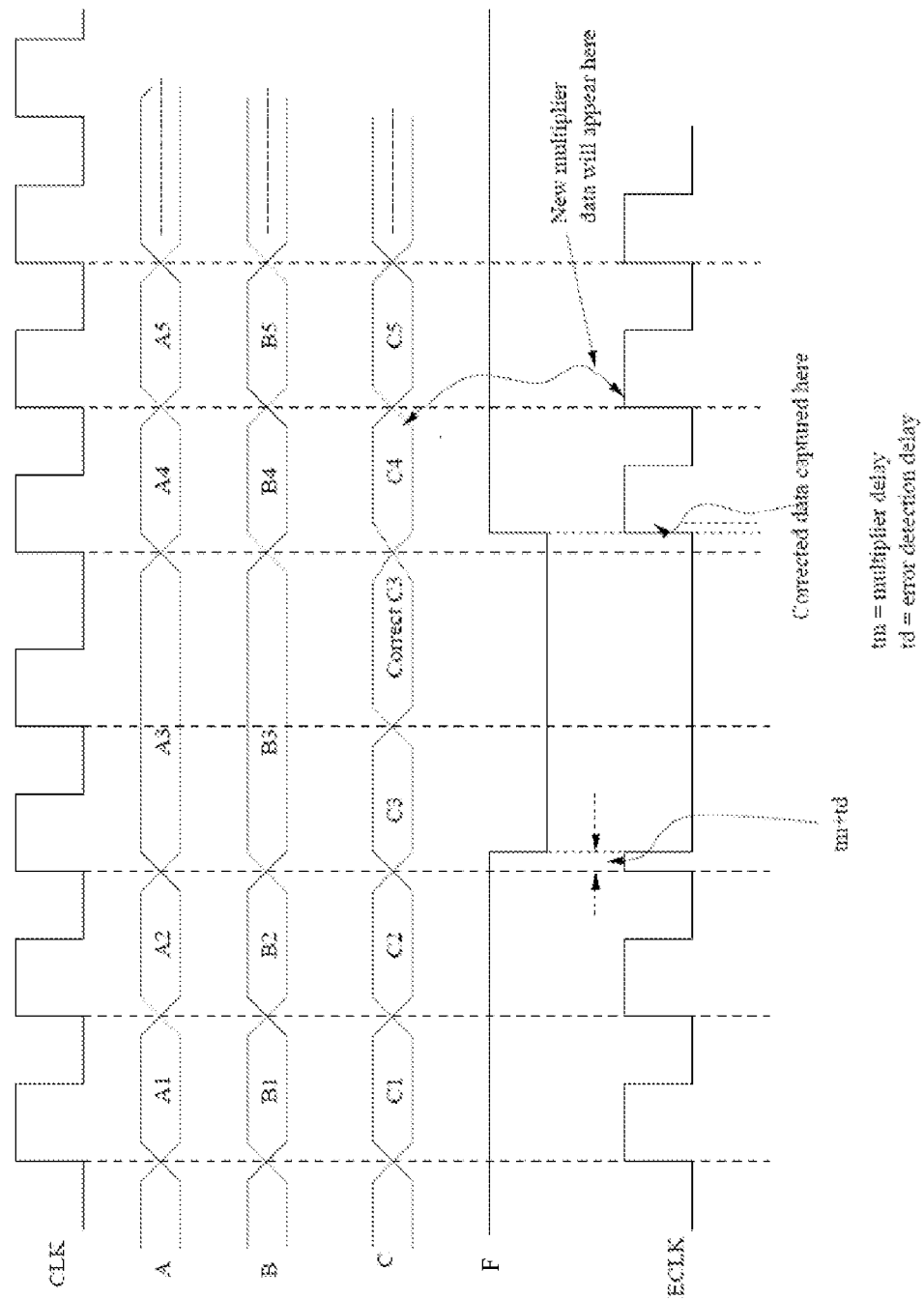
FIG. 6 is a timing diagram showing some of the signals of the circuit of FIG. 3.

By way of example, operation of the circuit 200 will be described with reference to FIG. 6.

Initially, during two periods of the clock signal clk, the circuit 200 receives operands A,B values (A1,B1 and A2,B2) from which correct values (C1 and C2) of the product C are generated. The error detection sub-circuit 250 sets the flag F to a logic-0 during these two periods, to indicate that no error has been detected.

When the value (C3) of the product C is in error, in the third period of the clock signal clk, this is detected by the error detection sub-circuit 250, which sets the flag F to a logic-0. Since the flag F is set to a logic-0, output enable sub-circuit 260 sets the gated clock eclk to a logic-0.

At the next rising edge of the clock signal clk, marking the beginning of the fourth period, the flag F remains set to a logic-0 which prevents the gated clock eclk from being set to a logic-1 in response to the clock signal clk transitioning to a logic-1. As a result, the erroneous value (C3) of the product C is not generated at the output 265c of the output register 265. This provides the correction generator 215 with the time it requires to generate the appropriate correction value E. Subsequently, and before the end of the fourth period, the combining circuit 220 receives the corresponding masked correcting value E', which it combines with the erroneous value (C3) of the product C to generate the corrected product C'.

At the next, i.e. fifth, clock period of the clock signal clk, two new values (A4,B4) of the operands A,B are introduced, which causes a product C having the correct value (C4) to be generated. Since at that time no error has been detected in the product C, the error detection sub-circuit 250 sets the flag F to a logic-1. This causes the gated clock eclk to change to a logic-1, since the clock signal clk is set to a logic-1. The change of the gated clock eclk, from a logic-0 to a logic-1, causes the value of the corrected product C' to be generated as the circuit output Cout at the output 265c of the output register 265.

At the sixth clock period of the clock signal clk the correct value (C4) of the product C is generated as the circuit output Cout at the output 265c of the output register 265.

Figures 7, 8:
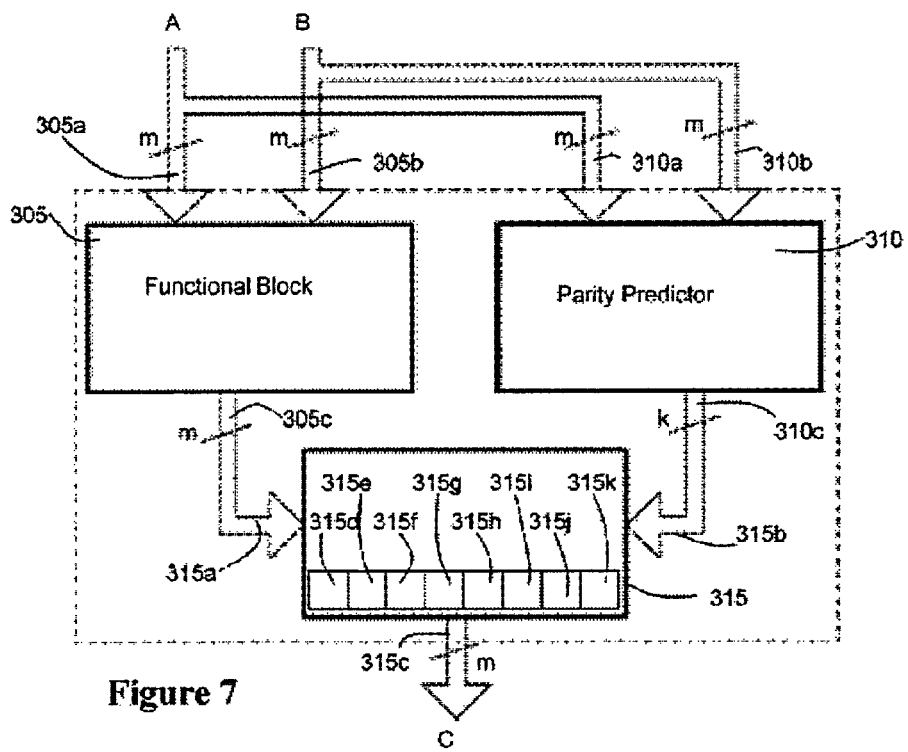
FIG. 7 is a schematic block diagram of an error correcting circuit according to a third embodiment of the invention.
FIG. 8 is a table showing check bits generated in the circuit of FIG. 7.

Referring to FIG. 7, an error correcting circuit according to a third embodiment of the invention comprises a functional block or sub-circuit 305 having two parallel inputs 305a, 305b having equal width m, and an output 305c also of the same width m. The functional block is arranged to receive at its inputs 305a, 305b respective operands A, B, and perform a function on the operands to generate the output C. In this embodiment the function is multiplication and the functional block 305 is a multiplier which is the same as that of the first embodiment. In order to detect and correct errors in the operation of the functional block 305, the circuit further comprises a parity predictor sub-circuit 310 and a correction block or sub-circuit 315. The parity predictor 310 has two parallel inputs 310a, 310b each of which has the same width m as the inputs to the functional block, and an output 310c of width k. The parity predictor 310 is arranged to receive the operands A, B at its inputs and to generate from them a parity code, which is a prediction of a parity code that should be produced as a result of a coding step performed on the output of the functional block 305 as will be described in more detail below. The correction block 315 has a first input 315a of the same width m as the output 305c of the functional block 305, and a second input 315b of the same width k as the output from the parity predictor 310, and an output 315c of the same with m as the output 305c of the functional block 105. The correction block 315 is arranged to receive at its first input 315a the result C output by the functional block 305, and to generate from it a parity code. The parity predictor 310 is arranged so that the predicted parity code it generates will, if no errors arise, be the same, for any given operands A, B, as that generated within the correction block 315. The correction block is then arranged to compare the parity code it receives from the parity predictor 310 with the parity code it generates from the result C, and from them, to detect and locate errors in the result C, and correct them, thereby to generate a corrected output C'.

Referring to FIG. 8, the parity code generated from the functional block output within the correction block 315, and predicted by the parity predictor 310, will now be described. In this embodiment the result C output by the functional block is a 20 bit output code comprising 20 bits C0 to C19. In general terms the parity codes is generated by dividing the result bits C0 to C19 into a first set of groups, in this case four rows of five bits each, and generating a parity code for each group, or row, and also dividing the result into a second set of groups, in this case five columns of four bits each, and generating a parity code for each group or column. The parity code for each of the groups can be generated in any suitable way, such as Hamming codes or BCH codes, which can be used to determine the number of errors in the group, but not their location in the group. The parity code output by the parity predictor comprises a set of parity codes each corresponding to one of the parity codes generated for one of the groups if bits in the correction block 315. By comparing the parity codes generated from the output C within the correction block 315, with those generated in the parity predictor 310, the correction block 315 can determine the number of errors in each of the first set of groups (i.e. each row) and the number of errors in each of the second set of groups (i.e. in each column). From these numbers, provided the number of errors is not too high, the exact location of the errors can be determined. This is because any combination of one row and one column uniquely identifies one bit in the output. Once the errors have been located, the correction block is arranged to correct them, to generate a corrected output C'.

It will be appreciated that the correction block may comprise separate sub-circuits arranged to perform each of the steps described. In this embodiment it comprises a first allocation sub-circuit 315d arranged to allocate the output bits to the first set of groups, a second allocation sub-circuit 315e arranged to allocate the output bits to the second set of groups, a first parity code generating sub-circuit 315f arranged to generate the parity code for each of the first set of groups, a second parity code generating sub-circuit 315g arranged to generate the parity codes for each of the second set of groups, a first error detection sub-circuit 315h arranged to compare the first set of parity codes with the corresponding codes generated by the parity predictor, and to determine the number of errors in each of the first set of bit groups, a second error detection sub-circuit 315i arranged to compare the second set of parity codes with the corresponding codes generated by the parity predictor, and to determine the number of errors in each of the second set of bit groups, an error location sub-circuit 315j arranged to identify, from the comparison of both sets of parity codes, the location of errors in the output C, and an error correction sub-circuit 315k arranged co correct the output C to generate the corrected output C'. However, it will be appreciated that each of these functions may not be performed by a separate dedicated part of the circuit, and in other embodiments the sub-circuits may be arranged to perform two or more of these functions in combination.

Furthermore it will be appreciated that, while the two sets of groups can easily be visualised by means of a rectangular table of rows and columns, the allocation step just needs to allocate each bit to two groups: one from the first set and one from the second set. For example, for the allocation shown in FIG. 8, assuming the bits C0 to C19 are arranged in numerical order in the output, the first five bits can be allocated to the first group in the first set (corresponding to the first row) and subsequent blocks of five bits can be allocated to subsequent groups in the first set. Then every fifth bit starting with the first can be allocated to the first group in the second set (corresponding to the first column), every fifth bit starting with the second bit can be allocated to the second group etc. It will also be appreciated that which bits are allocated to which groups is not critical. Considering the table format of FIG. 8, the bits could be arranged in any way within the 20 cells of the table, and the bits could still be grouped according to the rows and columns, though this may have no regular relationship with their position in the output.

In this embodiment the parity codes are generated using simple Hamming code that can detect double errors in each column, and BCH code that will detect as many as 6 errors in each row. For better understanding of the row- and column-wise encoding the parity coding procedure, as performed by the correction block 315, will now be described in more detail with an example circuit, considering a 20-bit bit parallel finite field multiplier as example of the functional block.

Error Detection Using Hamming Code Parity

The 20 bits are arranged in a table of four rows and five columns as shown in FIG. 8. The 20 bits of the output C are identified in order as C0 to C19 and each allocated to a position in the table as shown in FIG. 8. The rows are encoded with Hamming codes, and specifically, each row is encoded with Ham (9,5) code. In other words, 4 bit parity is required to detect a double error (i.e. up to two bit errors) in one row. The 4 parity information for the first row is given by the following expression:

$$P1 = C0 \cdot C2 \cdot C4 \tag{1}$$

$$P2 = C1 \cdot C2 \cdot C3 \cdot C4 \tag{2}$$

$$P3 = C0 \cdot C3 \cdot C4 \tag{3}$$

$$P4 = C1 \cdot C2 \cdot C4 \tag{4}$$

Similarly, each row is encoded separately and treated as a different code word, resulting in four four-bit parity codes, one for each row as shown in FIG. 8. The columns are each encoded using simple parity. Every two bits are protected by generating a column parity bit CP as shown in FIG. 8. The column parities of the first and second columns are determined as shown in the equations below. The other three column parities are generated exactly the same way as that of CP0 to CP3, as represented in the following:

$$CP0 = C0 \cdot C10 \tag{5}$$

$$CP1 = C5 \cdot C15 \tag{6}$$

$$CP2 = C1 \cdot C11 \tag{7}$$

$$CP3 = C6 \cdot C16 \tag{8}$$

The set of equations from Eqn. (1) to Eqn. (4), i.e. the error detection codes for the rows, are arranged to detect the occurrence multiple errors, up to two errors in each row. Similarly, the Eqn. (5) to Eqn. (8) computed for each column can be used to detect the presence of up to two errors in each column. From the error detection codes for columns and rows, provided not too many errors are present, the particular bit or bits that are in error can be detected. For example if only one error is present in bit C6, only one error will be detected in one column, column 2, and one error in one row, row 2. The bit that is in both row 2 and column 2 can therefore be identified as the bit that is in error, and corrected. This use of rows and columns, or more generally two different sets of groups, is referred to herein as cross parity error correction. Some of the error patterns that this technique can correct are shown in FIG. 9.

The parity predictor 310 may simply duplicate the structure of the functional block 305 and the sub-circuits in the correction block 315 that allocate the bits in the output from the functional block to the two sets of groups and derive the parity codes for those groups. However, in this embodiment, in order to save space and simplify the circuit, the parity predictor is designed to derive the parity codes in the simplest way from the system inputs A, B, without deriving the result C as an intermediate step. Since the result C does not need to be specifically derived, this can reduce the size of the circuit significantly.

Multiple Error Correction

The above description explains how errors are detected in both the first set of groups (rows) and the second set of groups (columns). But of course just identifying the errors is not sufficient to correct them. Using classical error correction codes, a separate process (needing a separate circuit sub-section often called a decoder) is needed in order to identify the erroneous bit positions and to correct them.

Figures 9A, 9B, 9C, 9D, 10:
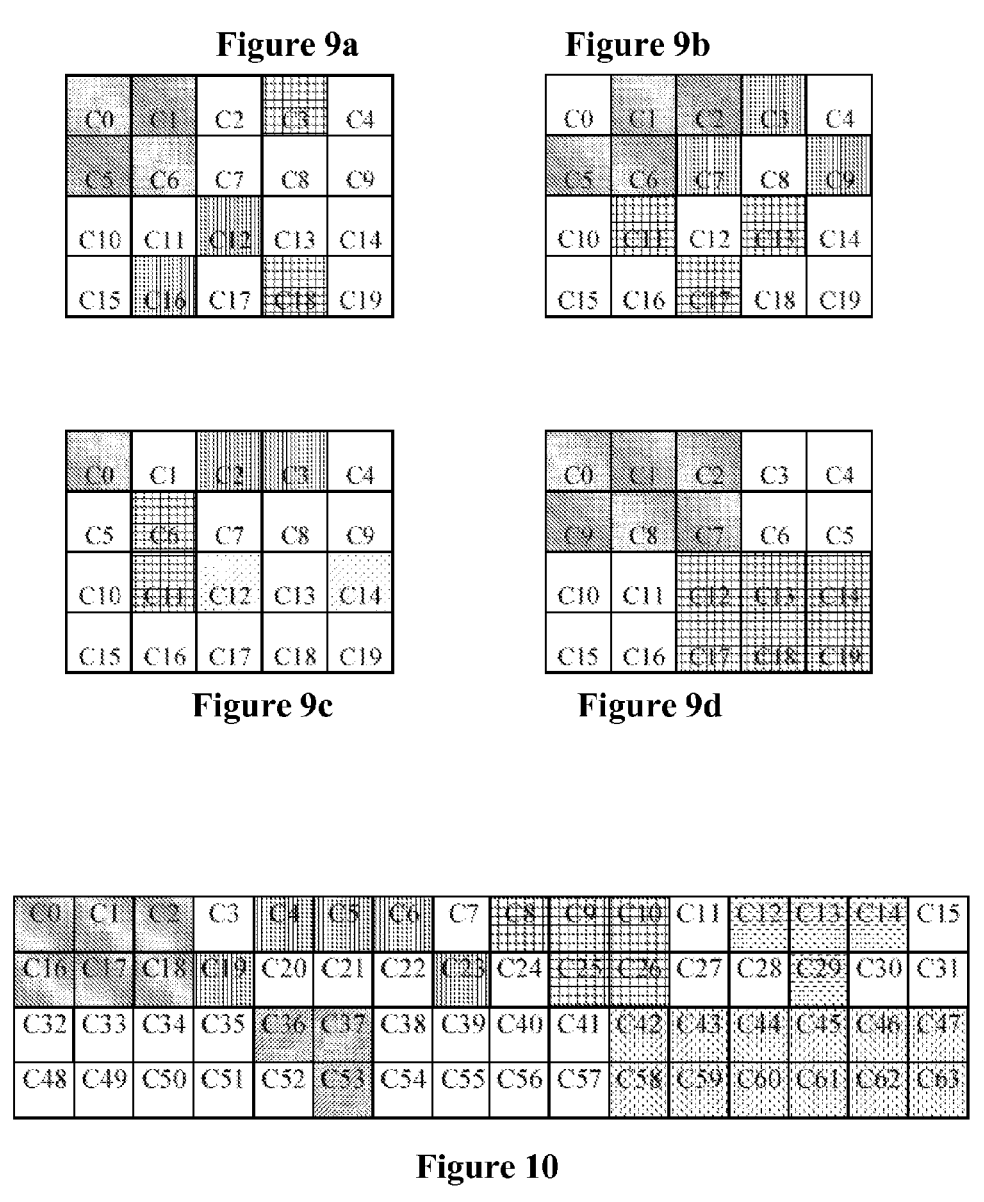

As indicated above, in the system described it is possible to eliminate the complex decoders using the fairly simple 'cross codes' and the correction block comprises, and is arranged to use, a simple AND-XOR logic to perform the correction. For example referring to FIG. 9a, in which the bits are arranged in a table equivalent to that of FIG. 8, suppose bits C0, C1, C5 and C6 are in error. The system can detect that there are two erroneous bits in row 1 (C0 and C2) using the Hamming code of row 1 and similarly that there are two errors in row 2 (C5 and C6) is detected by the Hamming code of row 2. But these codes alone can only determine that 2 bits in row 1 and row 2 are in error, and not their location. To find out which bits in each row are in error, the system is arranged to use the column parities as bit C0 is protected by CP0, bit C5 is protected by CP1. Similarly, the bits C2 and C7 are protected by CP2 and CP3. Using the combination of both row and column parity, the correction block 315 is arranged to determine which bits are in error. Similarly if bits C3 and C18 are in error, these can both be detected by this method, as can errors in bits C12 and C16. Referring to FIGS. 9b, 9c and 9d, other groups of bit errors that can be detected are: C1, C2, C5 and C6; C11, C13 and C17; C3, C7 and C9; C2 and C3; C6 and C11; C12 and C14; C0, C1, C2, C5, C6 and C7; C12, C13, C14, C17, C18 and C19.

Referring to FIG. 10, in a further embodiment the functional block is a 64-bit finite field multiplier. In this case the correction block is arranged to define the table as having four rows of 16 bits. In this embodiment the correction block is arranged to use BCH codes to detect the number of errors in each row (row error detection) as it can detect more number of errors in each row than the Hamming code. FIG. 10 shows example patterns of errors in a 64-bit finite field multiplier which can be located with BCH decoding in each row and simple parity coding in each column. For example with a BCH(3,1,16) code, we can easily detect up to 6 errors per row that hence clearly increase the number of bits being corrected as compared to the simple Hamming code.

Error Detection Using BCH Code Parity

The basic principle and design of the bit-parallel BCH code based multiple error detection will now be explained for the same 20 bit multiplier as shown in FIG. 8. It will be appreciated by the skilled man that the principle can be extended for the 64-bit multiplier. Let us consider a simple case of BCH(15,5,7), where n=15 and k=5. In this example, we consider bit-parallel PB multiplier over GF($2^5$). Let us consider the first five-bit row as a BCH code. Then, as n=15 and k=5, the following expression is obtained:

$$M(x) = C4x^4 + C3x^3 + C2x^2 + C1x + C0 \tag{9}$$

$$x^{n-k}M(x) = x^{n-k}(C4x^4 + C3x^3 + C2x^2 + C1x + C0) = C4x^{14} + C3x^{13} + C2x^{12} + C1x^{11} + C0x10. \tag{10}$$

The parity check bits are generated by the following:

$$P(x) = x^{n-k}M(x) \bmod g(x). \tag{11}$$

Let us consider the generator polynomial to be g(x)=$x^{10}$+$x^8$+$x^5$+$x^4$+$x^2$+x+1. Then the parity expression for the first row for 6-bit detection will be, $$P(x) = p9x^9 + p8x^8 + p7x^7 + p6x^6 + p5x^5 + p4x^4 + p3x^3 + p2x^2 + p1x^1 + p0 \tag{12}$$

If we consider a 3 bit correcting BCH code, it can detect 6 bit errors in a single code word. So to detect multiple errors in a 5 bit code, we need ten parity bits. The ten parity bits are given by:

| | |
|---|---|
| p0 = c0 + c2 + c4, | p0 = d0 + d2 + d4 + e0 + e1 + e2 + e3, |
| p1 = c0 + c1 + c2 + c3 + c4, | p1 = d0 + d1 + d2 + d3 + d4, |
| p2 = c0 + c1 + c3, | p2 = d0 + d1 + d3 + e1 + e2 + e3, |
| p3 = c1 + c2 + c4, | p3 = d1 + d2 + d4 + e0 + e2 + e3, |
| p4 = c0 + c3 + c4, | p4 = d0 + d3 + d4 + e0 + e2, |
| p5 = c0 + c1 + c2, | p5 = d0 + d1 + d2 + e2, |
| p6 = c1 + c2 + c3, | p6 = d1 + d2 + d3 + e0 + e3, |
| p7 = c2 + c3 + c4, | p7 = d2 + d3 + d4 + e1, |
| p8 = c0 + c2 + c3, | p8 = d0 + d2 + d3 + e0 + e1 + e3, |
| p9 = c1 + c3 + c4, | p9 = d0 + d3 + d4 + e0 + e2, | where dx and ex are inner product terms of the multiplier as defined as in Reyhani-Masoleh and M. A. Hasan, "Low Complexity Bit Parallel Architectures for Polynomial Basis Multiplication over GF(2m)," IEEE Trans. Computers, vol. 53, no. 8, pp. 945-959, 2004.

Figures 11, 12:
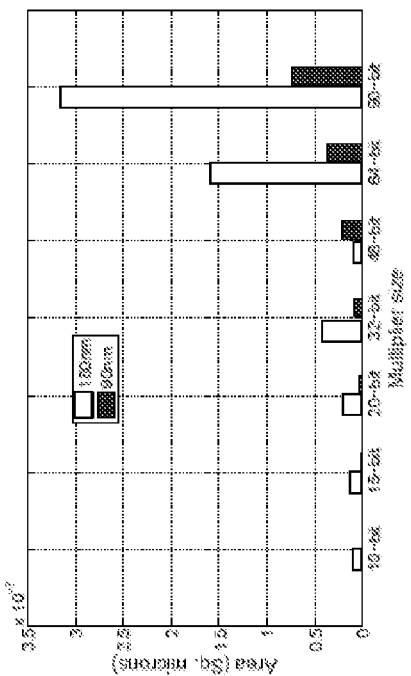
FIG. 11 is a table showing some examples of combinations of errors that can be detected in a further embodiment of the invention.
FIG. 12 is a graph showing the area of multiplier circuits of different sizes using 180 nm and 90 nm technologies.

Examples pattern for BCH code based cross parity code is as shown in FIG. 11. The system is arranged to use the 6 bit error detectable BCH code in each 16-bit row. In each 4-bit column it is arranged to use simple parity codes such as that in case of the hamming based scheme. Hence it can detect 2 errors in each column and 6 errors on each row. This means that the technique can correct up to certain 12 bit errors. Some of the pattern examples are highlighted in colors in FIG. 11. Similar patterns indicate the multiple error in the same group.

Cross Codes Over Digit Serial Multipliers

The proposed cross parity scheme will now be considered for a more practical multiplier such as a word level multiplier or a digit serial multiplier. For experimental purposes we have considered a 163-bit digit serial multiplier that is the standard size multiplier for secure ECC operations set by NIST and FIPS. This is believed to be the first attempt to synthesize a 163-bit multiple error correctable digit serial multiplier. This is because the known error detectable and correctable techniques are better suited for bit parallel multipliers as they give a huge area overhead because of the parallel complex error detection, decoding and correction part that runs parallel to the actual multiplier logic.

Referring to FIG. 12, the complexity of the proposed scheme is evaluated for such a digit serial multiplier architecture to better understand the space requirements for 10-bit, 15-bit, 20-bit, 32-bit, 48-bit, 64-bit, and 90-bit multiplier size.

The digit serial multiplication circuit for this experiment was designed using a single accumulator multiplier architecture. The multiplication algorithm was as shown below:
Input: $A(x) = \Sigma m-1$
$i=0$ $a_i.x^i$, $B(x) = \Sigma m-1$
$i=0$ $b_i.x^1$, $P(x)$.
Output: $C(x) = A(x).B(x) \bmod P(x)$. Step1: C=0.
Step2: for i=0 to $\lceil m/D \rceil - 1$ do Step3: $C = B_i.A + C$.
Step4: $A = A.a^D$.
Step5: end for
Step6: return (C mod P(x))

Experimental Results

The behavioral model of both Hamming and BCH based code were implemented using VHDL and checked for their functional correctness using Modelsim simulator. The schemes were checked and verified for bit parallel multiplier of various sizes including 10, 15, 20, 32, 48, 64 and 90-bit multiplier structures. The designs were then synthesized using Synopsys design compiler. Variation in area, power of these designs were evaluated using both 180 nm and 90 nm TSMC technologies.

Area and Power Analysis of Proposed Implementation

FIG. 12 shows the space consumptions of bit parallel multipliers of various sizes. FIGS. 13 and 14 show the area of error correcting blocks (including the parity generator) in both 180 and 90 nm technology. It is obvious from FIG. 13 that the space consumption of BCH based technique is only slightly higher than the Hamming based cross code. This is because of the fact that the area intensive decoder sections of both the codes are replaced by simple cross parity based error detector and corrector.

The area overhead of the proposed cross parity based method is depicted in Table I. It is observed for the experimental analysis that the area overhead for both BCH and Hamming based schemes are remarkably close. The area overhead for a very simple 0-bit multiplier is only 142%. As the multiplier size grows the percentage area overhead due to the parity generation circuit and the correction logic is getting smaller and eventually for a 90-bit multiplier that can correct multiple errors is only 101%. This is quite small as compared to the classic multiple error correction schemes based on only single error correction code. Even though the design does not entirely deal with all error patterns, it is very unlikely that a pattern will occur that is outside the scope of the proposed scheme and therefore cannot be corrected. This is because of the fact that the probability of a radiation particle interference that can cause multiple bit flip is for example only 1 in 1 million clock cycles. Hence the proposed scheme can provide excellent error masking capability with area overhead as low as 101%.

TABLE I

AREA OVERHEAD COMPARISION OF VARIOUS MULTIPLIER SIZES

| No. of bits | Hamming | BCH |
|---|---|---|
| 10 | 142% | 160% |
| 15 | 123% | 152% |
| 20 | 121% | 140% |
| 32 | 108% | 120% |
| 48 | 105% | 116% |
| 64 | 104% | 114% |
| 90 | 101% | 106% |

Table II compares our cross parity code approach with other error correction schemes available in open literature, in this case A. Reyhani-Masoleh and M. A. Hasan, "Low Complexity Bit Parallel Architectures for Polynomial Basis Multiplication over GF(2m)," *IEEE Trans. Computers, vol.* 53, no. 8, pp. 945-959, 2004; J. Mathew, J. Singh, A. M. Jabir, M. Hosseinabady, and D. K. Pradhan, "Fault Tolerant Bit Parallel Finite Field Multipliers using LDPC Codes," in *Proceedings of the IEEE International Symposium on Circuits and Systems,* 2008, pp. 1684-1687; and M. Poolakkaparambil, J. Mathew, A. M. Jabir, D. K. Pradhan, and S. P. Mohanty, "BCH Code Based Multiple Bit Error Correction in Finite Field Multiplier Circuits," in *Proceedings of the 12th IEEE International Symposium on Quality Electronic Design,* 2011, pp. 615-620.

For a fair comparison, we have used the 32-bit multiplier. It shows that our method can correct more number of errors with lesser area overhead as compared to the other well known designs.

TABLE II

COMPARISON WITH OTHER
APPROACHES FOR 32-BIT MULTIPLIER

| Property | Masoleh et al. 2004 | Mathew et al. 2008 [12] | BCH | Cross Parity (Ham) | Cross Parity (BCH) |
|---|---|---|---|---|---|
| # errors correction | single | single | 3 Errors | up to 6 Errors | up to 12 Errors |
| Coding technique | Hamming | LDPC | Classic BCH | Hamming + Simple Parity | BCH + Simple Parity |
| Overhead | >100% | >100% | 150.4% | 108% | 120.4% |

The power dissipation of the proposed scheme has been analysed. FIG. 15 and FIG. 16 compare the power consumption of both hamming and BCH based designs. As they have comparable area overhead, the power dissipation is roughly similar in the two schemes as well.

While the embodiments of FIGS. 7 to 16 described above relate to circuit design, in other embodiments, the system is a channel over which a communication is transmitted, and the output is the communication as received from the channel. The parity predictor is arranged at the transmission end of the channel and is arranged to generate the parity codes from the communication prior to transmission, and to attach the generated parity codes for transmission with the communication. The correction block is arranged at the receiver end of the system, and is arranged to receive the message over the channel, together with the parity codes from the parity predictor. The correction block can then perform the correction steps described above on the received message. In other cases the system may be a memory circuit, in which case the output may be data retrieved from the memory circuit, and the parity codes generated by the parity predictor may be stored in the memory and retrieved with the data, so that the correction circuit can perform the correction steps on the retrieved data.

The foregoing embodiments have been described by way of example only; the scope of the invention is defined by the following claims.

The invention claimed is:

1. An error-correcting circuit, arranged to receive a clock signal, comprising:
   a multiplier arranged to generate a first output from a first input and a second input;
   an error detector arranged to generate an error flag indicative of whether or not it has detected an error in the first output, based on the first output, the first input and the second input;
   a correction generator suitable for generating a correcting output after a first time period beginning with a timing event in the clock signal, based on the first output, the first input and the second input; and
   an output generator arranged to generate an output of the error-correcting circuit after a second time period beginning with the timing event in the clock signal,
   in which if the error flag indicates that an error has been detected in the first output then the second time period is longer than the first time period, or if the error flag indicates that an error has not been detected in the first output then the second time period is not longer than the first time period,
   and in which if the error flag indicates that an error has been detected in the first output then the output of the error-correcting circuit comprises a combination of the first output and the correcting output whereby the error detected in the first output is corrected, or if the error flag indicates that an error has not been detected in the first output then the output of the error-correcting circuit corresponds directly to the first output.

2. The circuit according to claim 1, in which the output generator comprises an output register having an output, the output of the output register being the output of the error-correcting circuit, and in which the output generator is arranged to delay the output register in updating its output when the error flag indicates that an error has been detected in the first output, thereby causing the second time period to be longer than the first time period.

3. The circuit according to claim 1, in which the output generator comprises an output enable component arranged to generate a gated clock based on the clock signal and the error flag, and in which the output register receives the gated clock at a clock input thereof, thereby delaying the output register in updating its output when the error flag indicates that an error has been detected in the first output.

4. The circuit according to claim 1, further comprising a check-bit generator, in which the check-bit generator is arranged to generate, based on the first input and the second input, at least one check bit, and in which the error detector and the correction generator are arranged to generate the error flag and the correcting output, respectively, based on the first output and said at least one check bit.

5. The circuit according to claim 4 in which the error detector is arranged to generate the error flag based on the first result and the at least one check bit, the error flag being indicative of whether or not the error detector has detected any one of a plurality of different errors that the error detector is arranged to detect, the plurality of different errors comprising an error in the first output and an error in the at least one check bit.

6. The circuit according to claim 4 in which the correction generator is suitable for generating the correcting output based on the first output and the at least one check bit, the correcting output being suitable for correcting any one of a plurality of different errors, the plurality of different errors comprising an error in the first output and an error in the at least one check bit.

7. The circuit according to claim 4 in which the check-bit generator is arranged to generate said at least one check bit directly from the first input and the second input, without separately generating the first output.

8. The circuit according to claim 1 in which the correction generator is arranged to generate the correcting output by generating an error location polynomial and then searching for roots of the error location polynomial, wherein the correction generator searches only for roots corresponding to the first output.

9. The circuit according to claim 1 in which the multiplier arranged to generate the first output is arranged to generate the first output by performing an arithmetic operation on the first and second inputs.

10. The circuit according to claim 9 in which the arithmetic operation is a finite field arithmetic operation, such as a multiplication over a Galois field GF(2k).

11. The circuit according to claim 1 wherein the output comprises a plurality of bits and the correction generator is arranged to allocate the output bits to a first set of groups and perform a first error detection step on each of the first set of groups, allocate the output bits to a second set of groups and perform a second error detection step on each of the second set of groups, and use the results of the first and second error detection steps to perform an error location step to locate errors in the output.

* * * * *